United States Patent
Oster et al.

(10) Patent No.: US 11,016,288 B2
(45) Date of Patent: May 25, 2021

(54) ADAPTABLE DISPLAYS USING PIEZOELECTRIC ACTUATORS

(71) Applicant: Intel Corporation, Santa Clara, CA (US)

(72) Inventors: Sasha N. Oster, Marion, IA (US); Feras Eid, Chandler, AZ (US); Johanna M. Swan, Scottsdale, AZ (US); Thomas L. Sounart, Chandler, AZ (US); Aleksandar Aleksov, Chandler, AZ (US); Shawna M. Liff, Scottsdale, AZ (US); Baris Bicen, Chandler, AZ (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 227 days.

(21) Appl. No.: 16/072,161

(22) PCT Filed: Apr. 1, 2016

(86) PCT No.: PCT/US2016/025761
§ 371 (c)(1),
(2) Date: Jul. 23, 2018

(87) PCT Pub. No.: WO2017/171883
PCT Pub. Date: Oct. 5, 2017

(65) Prior Publication Data
US 2019/0033576 A1 Jan. 31, 2019

(51) Int. Cl.
*G02B 26/08* (2006.01)
*H01L 27/20* (2006.01)
(Continued)

(52) U.S. Cl.
CPC .......... *G02B 26/0858* (2013.01); *H01L 27/20* (2013.01); *H01L 41/094* (2013.01); *H01L 41/0966* (2013.01); *H01L 41/253* (2013.01)

(58) Field of Classification Search
CPC ... G02B 26/0858; H01L 27/20; H01L 41/094; H01L 41/0966; H01L 41/253
See application file for complete search history.

(56) References Cited

U.S. PATENT DOCUMENTS

| | | | |
|---|---|---|---|
| 6,710,350 B2 | 3/2004 | Ruzga | |
| 7,483,200 B1 * | 1/2009 | Pan | G02B 26/0841 345/108 |

(Continued)

FOREIGN PATENT DOCUMENTS

WO  WO-02-31882  4/2002

OTHER PUBLICATIONS

International Search Report and Written Opinion for International Patent Application No. PCT/US2016/025761 dated Nov. 17, 2016, 15 pgs.

(Continued)

*Primary Examiner* — Euncha P Cherry
(74) *Attorney, Agent, or Firm* — Schwabe, Williamson & Wyatt, P.C.

(57) ABSTRACT

Embodiments of the invention include a display formed on an organic substrate and methods of forming such a device. According to an embodiment, an array of pixel mirrors may be formed on the organic substrate. For example, each of the pixel mirrors is actuatable about one or more axes out of the plane of the organic substrate. Additionally, embodiments of the invention may include an array of routing mirrors formed on the organic substrate. According to an embodiment, each of the routing mirrors is actuatable about two axes out of the plane of the organic substrate. In embodi- (Continued)

ments of the invention, a light source may be used for emitting light towards the array of routing mirrors. For example, light emitted from the light source may be reflected to one or more of the pixel mirrors by one of the routing mirrors.

25 Claims, 12 Drawing Sheets

(51) Int. Cl.
*H01L 41/09* (2006.01)
*H01L 41/253* (2013.01)

(56) References Cited

U.S. PATENT DOCUMENTS

2006/0262378 A1* 11/2006 Machida ............ G02B 26/0858
　　　　　　　　　　　　　　　　　　　　　　　　　359/290
2015/0253566 A1　　9/2015 Swartz et al.

OTHER PUBLICATIONS

International Preliminary Report on Patentability for International Patent Application No. PCT/US2016/025761, dated Oct. 11, 2018, 12 pages.

* cited by examiner

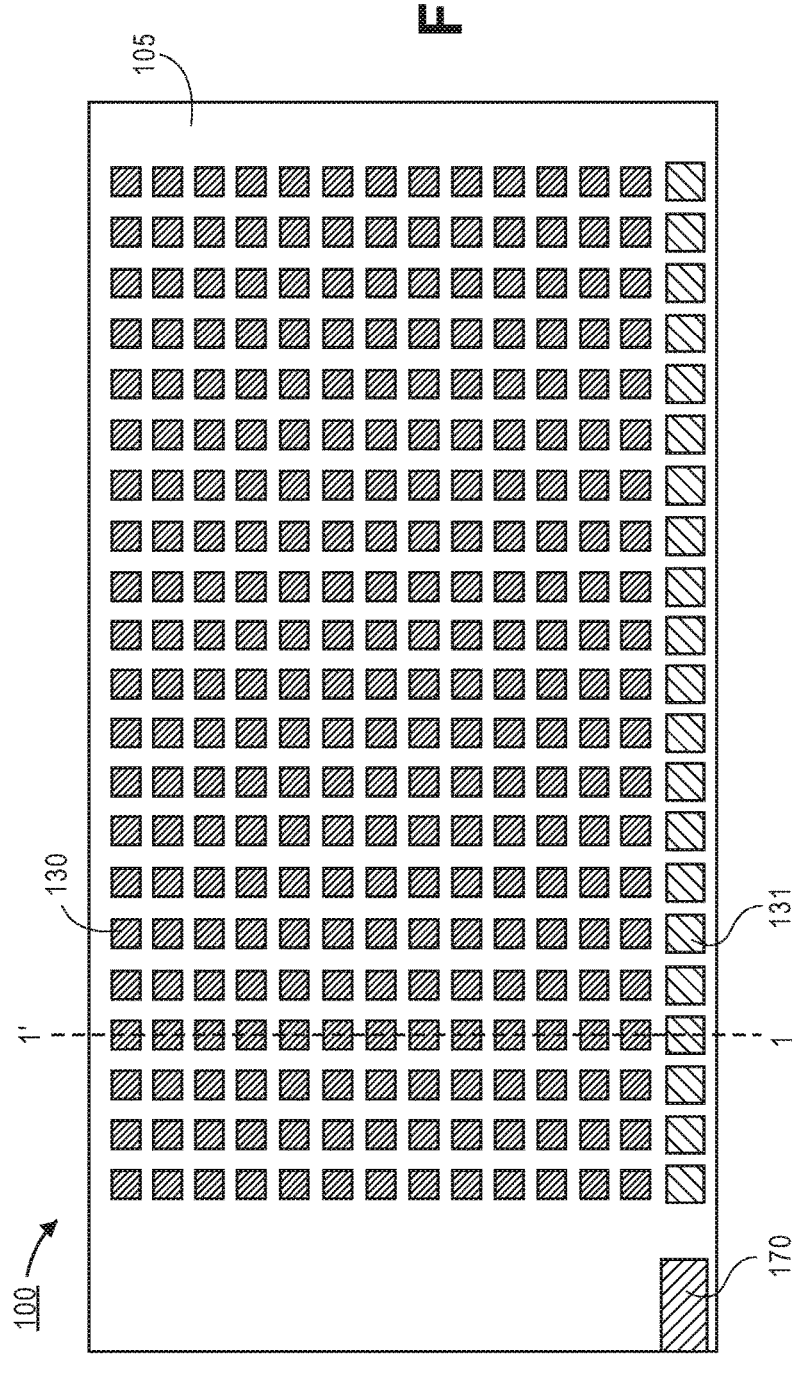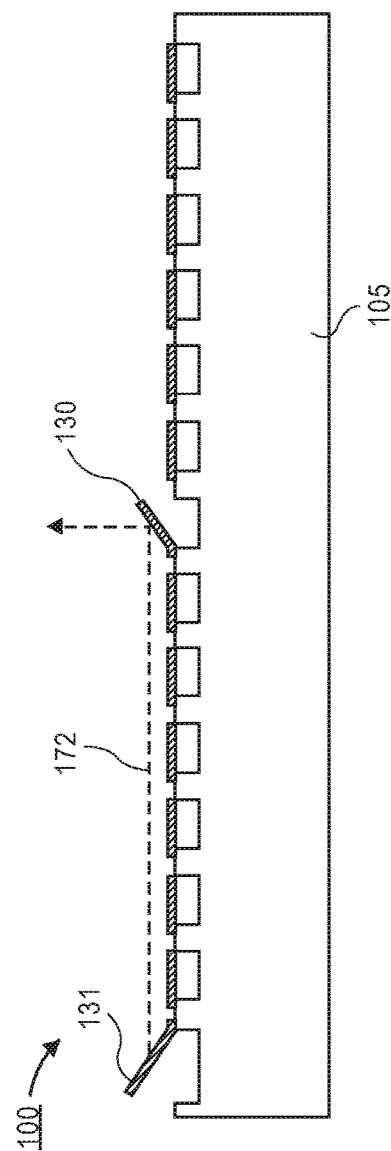

ADAPTABLE DISPLAYS USING PIEZOELECTRIC ACTUATORS

CROSS-REFERENCE TO RELATED APPLICATION

This patent application is a U.S. National Phase Application under 35 U.S.C. § 371 of International Application No. PCT/US2016/025761, filed Apr. 1, 2016, entitled "ADAPTABLE DISPLAYS USING PIEZOELECTRIC ACTUATORS," which designates the United States of America, the entire disclosure of which is hereby incorporated by reference in its entirety and for all purposes.

FIELD OF THE INVENTION

Embodiments of the present invention relate generally to display technologies. In particular, embodiments of the present invention relate to pixel mirrors that are integrated into organic substrates used for displays and methods for manufacturing such devices.

BACKGROUND OF THE INVENTION

Displays in currently available consumer electronics are mostly two dimensional (2-D), rigid, and have fixed viewing angles. The market share for displays used in tablets, phones, and wrist-worn wearables is currently dominated by organic light emitting diode (OLED) displays or liquid crystal displays (LCDs). In both technologies, each sub-pixel is individually written to a certain brightness. For example, a row/column write configuration may be used in order to reduce routing requirements. In OLEDs, this means an individual organic LED is controlled, and in LCDs, a back light is employed and a polarizer is controlled that affects the brightness of each sub-pixel. In both of these cases, the only variable the electronics can control is the brightness of the pixel. The projection angle of each sub-pixel is fixed (perpendicular to the plane of the display) and is determined by the OLED or polarizer construction. While OLED and LCD displays have not been successfully integrated onto stretchable substrates in commercialized devices, if they were, when stretched, the image would stretch with the substrate. Software correction could be implemented to adjust the image, but would result in a decrease in the resolution of the image.

In addition to 2-D displays, some three dimensional (3-D) displays are currently on the market. The basis of nearly all commercially available 3-D displays is stereoscopy in which slightly different images are shown to the left and right eye, producing a 3-D effect. This is often accomplished by pairing glasses with a display. The glasses allow the "left eye image" to display to the left eye only and the "right eye image" to display to the right eye only based on timing synchronization between the display and glasses, polarization, or color. There are a limited number of 3-D displays which do not require glasses. These also employ stereoscopy by projecting different images to the left and right eye. While these technologies remove the need for glasses, they suffer from requiring very specific viewing angles and distances due to the fixed viewing angles of LCD and OLED technologies.

Yet another class of displays are projection based displays based on steerable lasers. In this technology, a mirror or series of mirrors is steered to produce an image on a surface (such as a wall) or project directly onto the eye (such as in a head worn wearable). When projected on the eye, achieving the correct viewing distance is critical. These displays can be very versatile in adapting for viewing angle or distance (though not all are) by adjusting the steering mirrors, but ultimately need a surface to project upon. This makes them incompatible with tablets, phones, and wrist worn-wearable devices.

BRIEF DESCRIPTION OF THE DRAWINGS

FIG. 1A a plan view illustration of a display that includes a plurality of pixel mirrors formed in an array, according to an embodiment of the invention.

FIG. 1B is a cross-sectional illustration of the display in FIG. 1A, according to an embodiment of the invention.

DETAILED DESCRIPTION OF THE INVENTION

Figure 2:
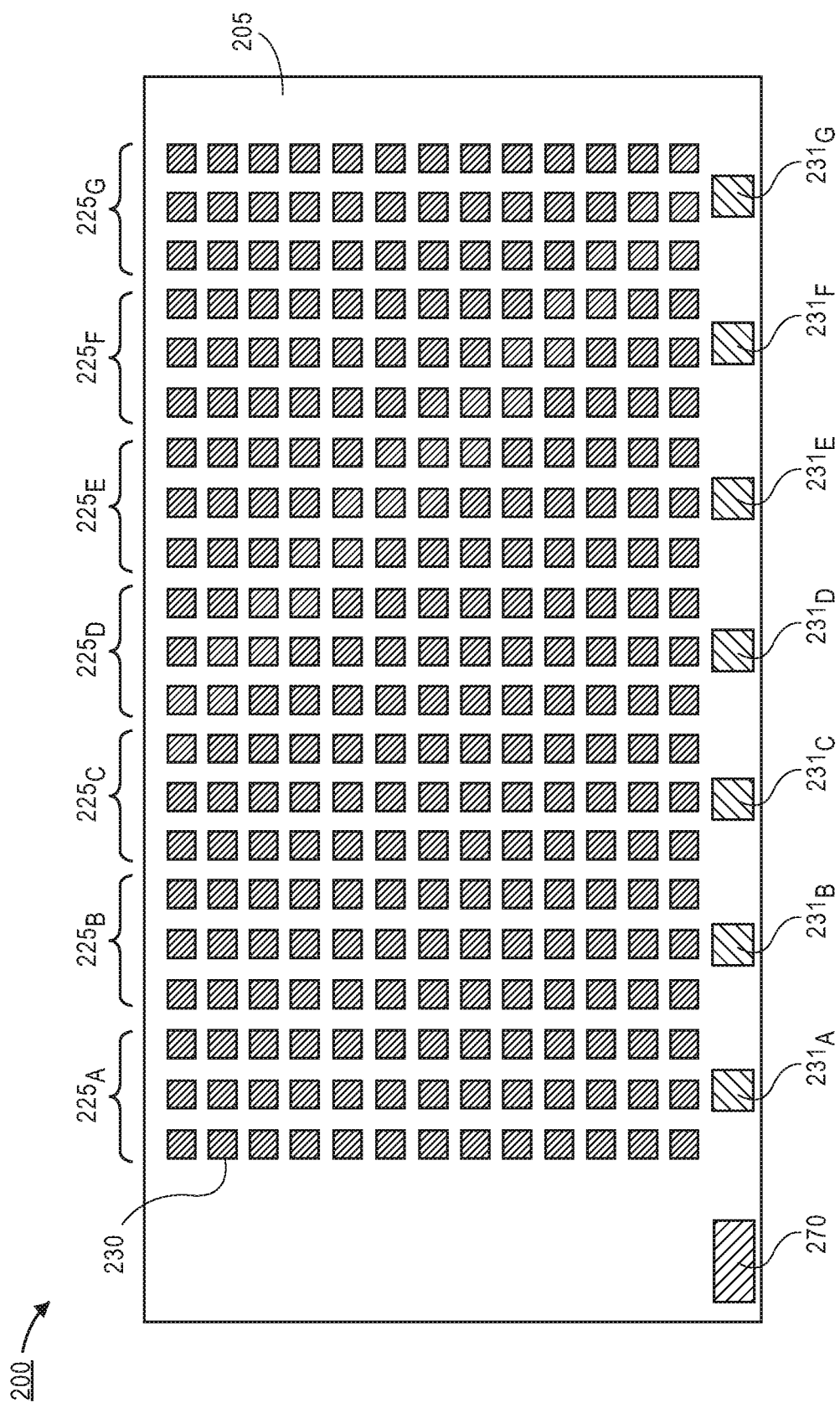
FIG. 2 is a plan view illustration of a display that includes a plurality of pixel mirrors, according to an additional embodiment of the invention.

Described herein are systems that include a display that includes pixel mirrors formed on an organic substrate and methods of forming such displays. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Embodiments of the invention include adaptable displays and methods of forming such devices. Adaptable displays formed in accordance with embodiments of the invention allow changes in the reflection angle of each sub-pixel or pixel. This allows for changes in the viewing angle, 3-D display, and compensation for flexing or bending of the display. These functionalities are achieved by using a display construction in which each sub-pixel or pixel is composed of an individual steerable mirror which reflects light from a source. According to an embodiment, piezoelectric actuation may be used to provide analog control of the projection angle of any individual pixel. Furthermore, the process used to fabricate the piezoelectric mirrors allows for the mirrors to be fabricated in a rigid, flexible, or stretchable substrate in high volume using a large-size (e.g., panel-level) substrate process. Accordingly, embodiments of the invention allow for a display that is fabricated in a cost effective manner.

Referring now to FIG. 1A, a plan view illustration of a display 100 is shown, according to an embodiment of the invention. In one embodiment, the substrate 105 is an organic substrate. By way of example, the substrate 105 may be a polymer material, such as, for example, polyimide, epoxy, or build-up film. The substrate 105 may include one or more layers (i.e., build-up layers). According to an embodiment, the substrate 105 may also be a bendable or otherwise flexible substrate 105.

In order to generate the displayed image, embodiments of the invention may include an optical system that includes a plurality of pixel mirrors 130, a plurality of routing mirrors 131, and one or more light sources 170. According to an embodiment, the pixel mirrors 130 may be arranged in a plurality of rows and columns with each pixel mirror 130 corresponding to a an individual pixel or sub-pixel of the displayed image. The number of columns and rows of pixel mirrors 130 illustrated in FIG. 1A is exemplary in nature, and any number of pixel mirrors 130 may be used, according to embodiments of the invention. In one example, there may be 1920 rows and 1080 columns of pixel mirrors 130, in order to produce a resolution at 1080p. However, more or fewer rows and columns may also be used depending on the needs of the display.

According to an embodiment, the pixel mirrors 130 may be steerable mirrors. For example, the pixel mirrors 130 may be actuated about one or two axes so that they deflect out of the plane of the illustration in FIG. 1A. Embodiments of the invention include pixel mirrors 130 that are steered with piezoelectric actuators. Accordingly, the deflection of each pixel mirror 130 may be proportional to the voltage applied to each pixel mirror 130, thereby allowing for analog control of each mirror to any deflection angle below a maximum deflection angle. The maximum deflection angle may be dependent on the materials used to form the pixel mirrors 130. In an embodiment, the maximum angle of deflection of the pixel mirrors 130 may depend on the yield strength of the materials used. For example, when the actuation arms of the pixel mirrors 130 are copper, the pixel mirrors 130 may have a maximum deflection angle of approximately 30° (i.e., below 30°, the deflection of the pixel mirrors 130 may be only elastic deformation). However, deflecting the pixel mirrors 130 to that extent may require relatively high voltages, thereby increasing power consumption. Lower voltages (e.g., 10-20 volts) may allow for more modest deflection angles (e.g., less than approximately 10°) that significantly reduces power consumption, while still providing sufficient deflection to implement embodiments of the invention. A more detailed explanation of the piezoelectric actuation and the structure of the pixel mirrors 130 is described in greater detail below.

Additionally, routing mirrors 131 may be included on the display 100 to allow for light to be guided to each pixel mirror 130. In the illustrated embodiment, each column of pixel mirrors 130 are aligned (i.e., centered) with a routing mirror 131. When unactuated, the routing mirrors 131 may be below the path of light emitted by the light source 170. In order to reflect the light, the routing mirror may be actuated about a first axis out of the plane of the display in order to enter the path of the light. The routing mirror 131 may also be actuated about a second axis out of the plane of the display in order to reflect the light along a column of routing pixel mirrors 130. One of the pixel mirrors 130 in the column may then be actuated to reflect the light out of the plane of the display 100, toward the viewer. According to an embodiment, the routing mirrors 131 may be structurally similar to the pixel mirrors 130, with the exception that they are steerable about two axes. A more detailed explanation of the piezoelectric actuation and structure of the routing mirrors 131 capable of reflecting about two axes is described in greater detail below.

Referring now to FIG. 1B, a cross-sectional illustration along line 1-1' in FIG. 1A is shown, according to an embodiment of the invention. As illustrated, the routing mirror 131 is actuated out of the plane of the display 100 to reflect light 172 along a column of pixel mirrors 130. In the illustrated embodiment, the routing mirror 131 is shown as being actuated about a single axis. However, it is to be appreciated that the routing mirror 131 is also actuated about an axis not visible in FIG. 2B in order to reflect the light 172 from the light source 170. According to an embodiment, the pixel mirror 130 that will reflect the light 172 to the viewer is actuated out of the plane of the display 100. In the illustrated embodiment, the light 172 is reflected at an angle approximately perpendicular to the display 100 by the pixel mirror 130, though embodiments are not limited to such configurations. For example, the light 172 may be reflected at any desired angle, limited only by the maximum deflection of the pixel mirrors 130.

In order to display an entire projected image with the display 100, the routing mirrors 131 and the pixel mirrors 130 may be actuated at very high speed, such that all projected pixels seem to appear simultaneously to the human eye. In an embodiment where each routing mirror 131 is responsible for reflecting light along a single column, the frequency of actuation required for the routing mirrors 131 may be $f_r R$ where $f_r$ is the framerate and R is the number of rows. The frequency of the pixel mirrors 130 may be $f_r RC$ where C is the number of columns. In currently available displays, there may be 1920 rows and 1080 columns with a frame rate of 30 frames per second (fps) or 60 fps. In order to achieve desired color and brightness, the light source 170 may be modulated and synchronized with the displaying pixel. Embodiments of the invention may include any suitable light source, such as a laser or a laser diode. In some embodiments, more than one light source 170 may be used (e.g., to provide multiple colors of light). In such embodiments, each mirror may be sized to accept light from each of the light sources. Alternatively, the number of mirrors at each pixel location and routing location may match the number of light sources 170.

Referring now to FIG. 2, a plan view illustration of a display 200 is shown according to an additional embodiment of the invention. The display 200 is substantially similar to the display 100 illustrated in FIG. 1A, with the exception that each of the routing mirrors 231 is now responsible for routing light to more than one column of pixel mirrors 230. For example, in the illustrated embodiment, each routing mirror $231_A$-$231_F$ is responsible for routing light to three columns of pixel mirrors 230 (e.g., routing mirror $231_A$ is responsible for reflecting light to each pixel mirror 230 in group $225_A$). Since the routing mirrors 231 are not always aligned along the same column as the pixel mirror 230 to which they are reflecting light, embodiments of the invention may also include pixel mirrors 230 that are steerable about two axes. In such embodiments, the pixel mirrors 230 and the routing mirrors 231 may have substantially the same structure. In the illustrated embodiment, a plurality of routing mirrors 231 are shown, but embodiments are not limited to such configurations. For example, a single routing mirror 231 may be used to provide reflected light to all of the pixel mirrors 230.

Figure 3:
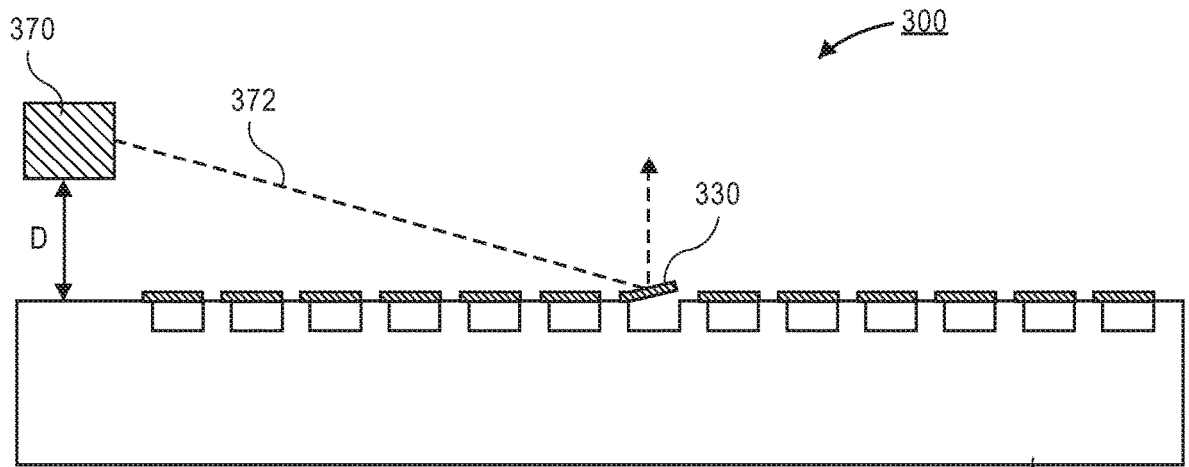
FIG. 3 is a cross-sectional illustration of a display that includes a light source that is not in the same plane as the pixel mirrors, according to an embodiment of the invention.

Referring now to FIG. 3, a cross-sectional illustration of a display 300 that includes a light source 370 that is raised a distance D above the plane of the display substrate 305 is shown, according to an embodiment of the invention. According to an embodiment, the light source 370 may be a microelectromechanical systems (MEMS) steerable laser. In such embodiments, the light 372 from the light source 370 may be steered directly to the pixel mirrors 330 and the routing mirrors 331 may be omitted.

Figure 4A:
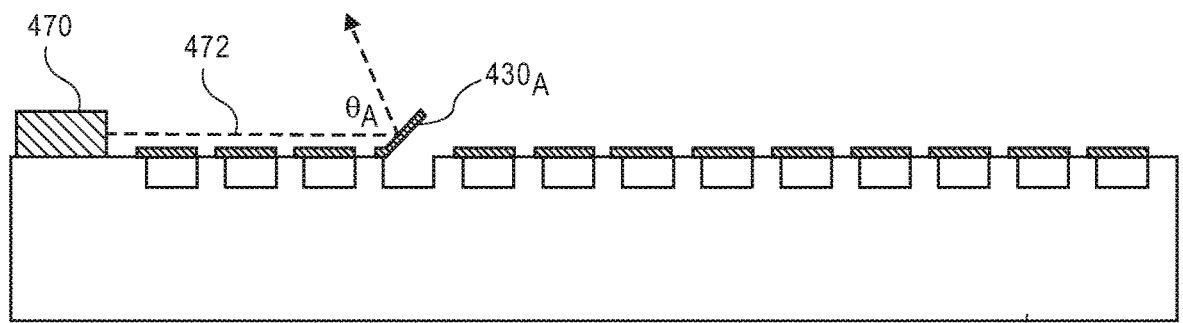
FIG. 4A is a cross-sectional illustration of a display that includes a pixel being displayed at a first viewing angle, according to an embodiment of the invention.
Figure 4B:
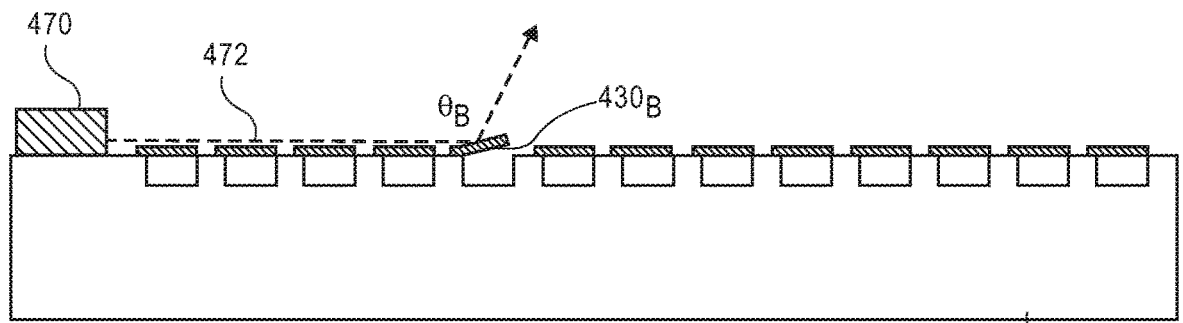
FIG. 4B is a cross-sectional illustration of a display that includes a pixel being displayed at a second viewing angle, according to an embodiment of the invention.

Referring now to FIGS. 4A and 4B, cross-sectional illustrations of a display 400 that include two different projection angles are shown, according to an embodiment of the invention. In FIGS. 4A and 4B, a light source 470 is shown emitting light 472 directly towards a column of pixel mirrors 430 in order to not obscure the Figures. It is to be appreciated that the light source 470 may be replaced with a routing mirror similar to the routing mirrors described above. Additionally, while the light source 470 is shown as being in the plane of the display 400, it is to be appreciated that embodiments may also include a light source 470 that is out of the plane of the display 400, similar to the light source 370 described in FIG. 3.

In FIG. 4A the light 472 is reflected out of the plane of the display 400 by pixel mirror $430_A$ at an angle $\theta_A$. The angle $\theta_A$ may be changed by increasing or decreasing the amount of deflection of the pixel mirror 430. Accordingly, the viewing angle of the display may be adjusted to provide an optimum viewing experience to a user sitting at any angle. In one embodiment, every pixel mirror 430 may be deflected to the same angle $\theta_A$. Embodiments of the invention may allow for automatic adjustment of the deflection angle $\theta_A$. For example, a camera may be included on the display 400 that is able to obtain an image or video of the display's surroundings. The image or video may be used to determine the location of the viewer or viewers. In such an embodiment, the display may automatically adjust the deflection angle $\theta_A$ to provide an optimum viewing experience based on the position of the viewers.

According to an embodiment, the deflection angle θ of the light may also be changed for each pixel mirror 430. For example, in FIG. 4B the deflection angle of the subsequent pixel mirror $430_B$ has been changed. Such an embodiment may allow for a stereoscopically produced 3-D image to be projected to a viewer without the need for glasses or excessively restrictive viewing distances and angles. In one an embodiment, half of the pixel mirrors 430 may steer the light 472 to the left eye of a viewer and the other half of the pixel mirrors 430 may steer the light 472 to the right eye of a viewer. For example, FIG. 4A illustrates pixel mirror $430_A$ steering light to a viewer's right eye and FIG. 4B illustrates pixel mirror $430_B$ steering light to a viewer's left eye. In embodiments where the pixel mirrors 430 steer light to both eyes simultaneously (i.e., pixel mirrors 430 alternate between deflecting light to the left and right eye), a stereoscopic 3-D image may be produced with half the resolution. Alternatively, all of the pixel mirrors 430 may be steered to the left eye for a frame and then all of the pixel mirrors 430 may be steered to the right eye for a frame. Such an embodiment may produce a stereoscopic 3-D image at half the framerate.

As a viewer changes position relative to the display, the angle needed to reach the left and right eyes changes as well. As such, the angle at which the pixel mirrors 430 reflect the light 472 may also be changed to match the position of the viewer. The adjustment to the angle of the pixel mirrors may be done automatically when a camera system is used to track the position of the viewers. Accordingly, 3-D images may be produced by the display without restrictions on viewing angle or distance from the display.

In addition to producing a 3-D image, the ability to change the viewing angle may allow for different images to be projected to different viewers. For example, a viewer to the left of the display 400 may be shown a first image (i.e., with a deflection angle similar to the one shown in FIG. 4A) and a viewer to the right of the display may be shown a second image (i.e., with a deflection angle similar to the one shown in FIG. 4B). According to an embodiment, the images may be switched simultaneously (i.e., every other pixel mirror 430, resulting in half the resolution) or consecutively (i.e., every other frame, resulting in half the framerate).

According to an additional embodiment of the invention, an adaptable display may be used to provide a projected image that is not deformed when the display is flexed. A display that is able to compensate for deformation is illustrated in FIG. 5.

Figure 5:
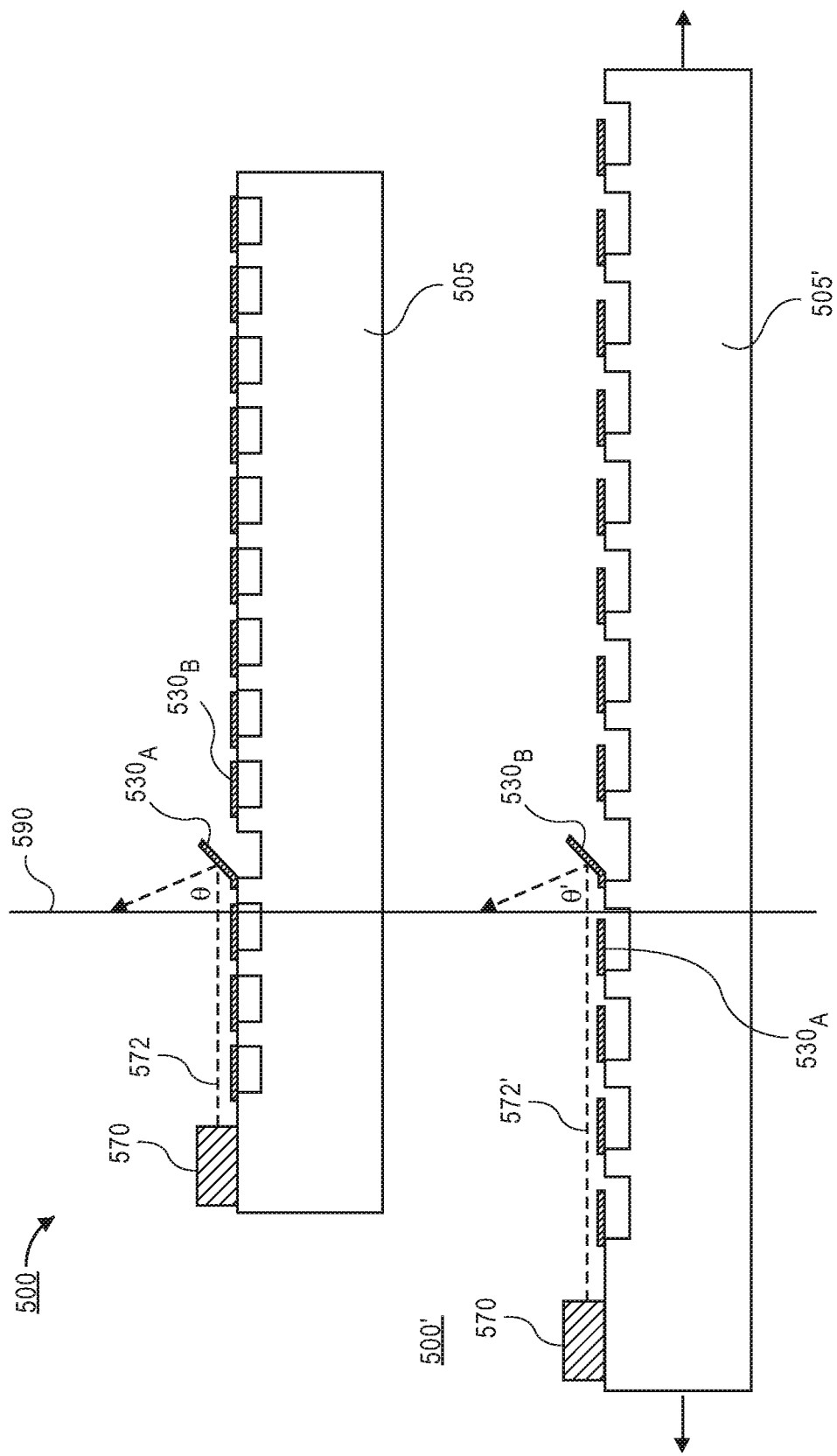
FIG. 5 is a pair of cross-sectional illustrations of a flexible display with the first cross-sectional illustration depicting the display in an unstretched state and the second cross-sectional illustration depicting the display in a stretched state, according to an embodiment of the invention.

Referring now to FIG. 5, a pair of cross-sectional illustrations of a flexible display in an unflexed state display 500 and a flexed state display 500' are shown according to an embodiment of the invention. In FIG. 5 the line 590 passing through the unflexed display 500 and the flexed display 500' represents a desired image projection plane. In order to produce a non-distorted image, the flexed display 500' needs to replicate the deflection angle θ and position of light 572 reflected off pixel mirror $530_A$ in the unflexed display 500. In the flexed display 500' the substrate 505 has been stretched, causing the pixel mirrors to change positions. In order to produce a non-distorted image, a second pixel mirror $530_B$ may be used to provide an angle of deflection θ' that allows for the light 572 to be directed to the same position and at the same angle (with respect to the image projection plane 590) that were produced by the first pixel mirror $530_A$. According to an embodiment, the determination of which pixel mirror 530 of the flexed display 500 should be actuated and the angle θ' needed to match the unflexed image may be dependent on the amount of deformation in the substrate. As such, embodiments of the invention may also include one or more sensors (e.g., strain gauges) to determine the deformation of the display. Accordingly, a non-distorted image may be projected even when the display is stretched.

Additional embodiments of the invention may utilize similar processes to adjust for deformation of the display that occurs out of the plane of the display (e.g., bending). When the display is bent out of plane, it may not be possible to address all of the mirrors with a single light source that only emits light in the plane of the display. As such additional embodiments of the invention may include a plurality of light sources. Such an embodiment is illustrate in FIG. 6.

Figure 6:
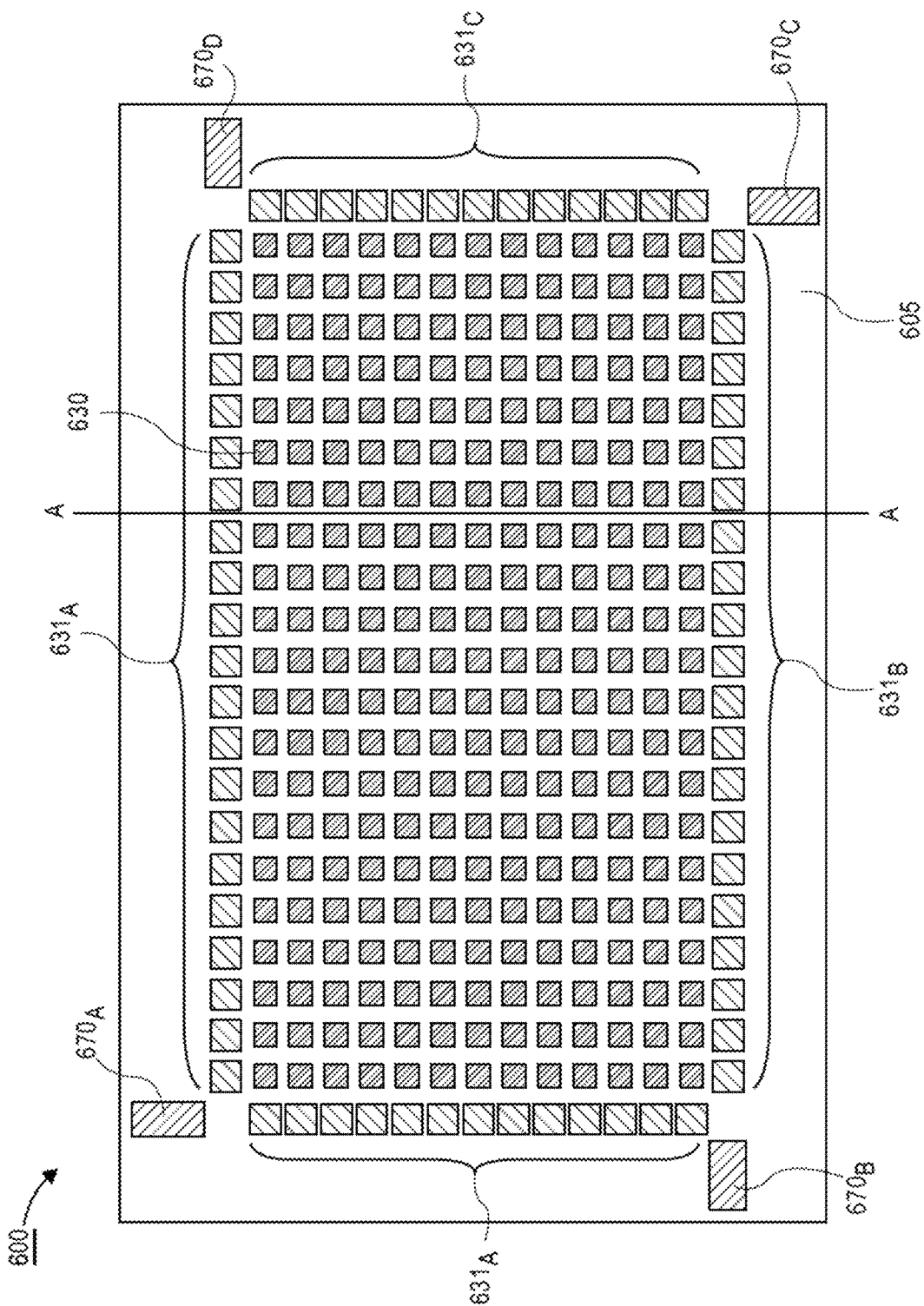
FIG. 6 is a plan view illustration of a display that includes a plurality of light sources formed on the substrate to allow for projection of an image when the substrate is flexed, according to an embodiment of the invention.

Referring no to FIG. 6, a plan view illustration of a display 600 with a plurality of light sources 670 is shown, according to an embodiment of the invention. In an embodiment, each of the light sources may address different routing mirrors 631. For example, light source $670_A$ may be used for addressing routing mirrors $631_A$. In such embodiments, each of the pixel mirrors 630 may be able to receive light reflected from multiple light sources 670. This is beneficial, when the substrate is bent out of plane and one or more of light sources 670 may be in different planes than some of the pixel mirrors 630. For example, if the display 600 is bent about axis A-A (e.g., the portion of the display to the right of axis A-A is bent out of the plane of FIG. 6 with the portion of the display to the left of axis A-A remaining in the plane of FIG. 6) light source $670_A$ may not be able to be reflected to the pixel mirrors 630 to the right of axis A-A. Instead of losing the ability to use the pixel mirrors to the right of axis A-A, a different light source may be used to address these pixel mirrors 630 (e.g., light source $670_C$ may be used since it will remain in the same plane as the pixel mirrors 630 in the deflected portion of the display 600). As such, embodiments of the invention allow for an image to be projected from all of the pixel mirrors, even when the display is bent out of plane.

Embodiments of the invention described above rely on pixel mirrors and routing mirrors that are steerable mirrors and that are integrated into a substrate. The structure of the steerable mirrors, the actuation mechanism, and processes for forming such mirrors are described in greater detail below with respect to FIGS. 7A-9E. While the mirrors described below are specifically referred to as pixel mirrors, it is to be appreciated that substantially similar structures and fabrication processes may be used to form routing mirrors as well.

Figure 7A:
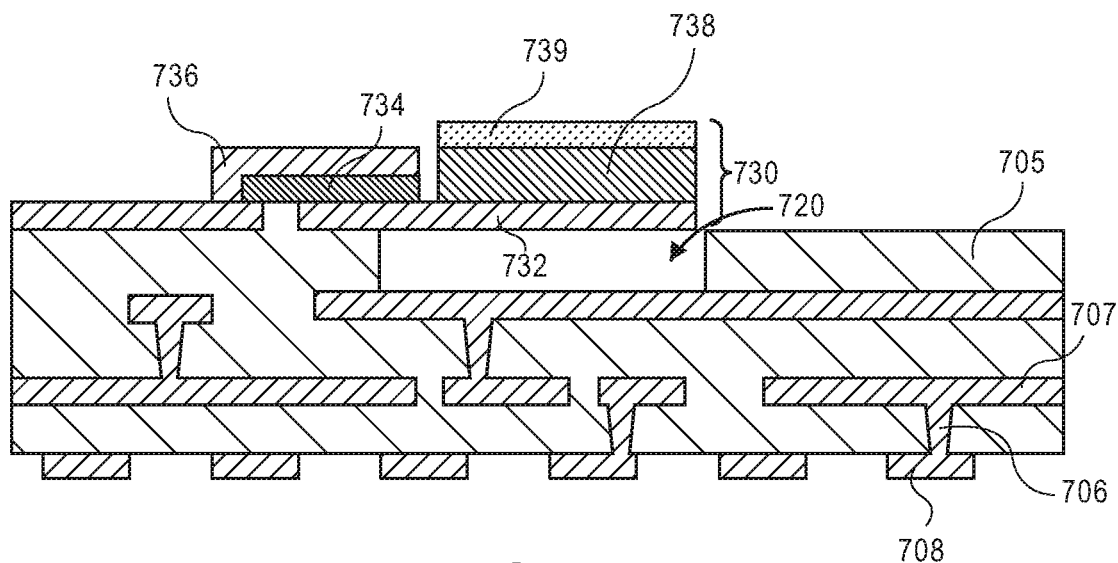
FIG. 7A is a cross-sectional illustration of a piezoelectric mirror formed on an organic substrate, according to an embodiment of the invention.

Referring now to FIG. 7A, a cross-sectional illustration of an organic substrate 705 that includes a pixel mirror 730 is shown, according to an embodiment of the invention. In an embodiment, the organic substrate 705 may be any suitable organic material. By way of example, the organic substrate 705 may be a polymer material, such as, for example, polyimide, epoxy, or build-up film. The organic substrate 705 may include one or more layers (i.e., build-up layers). According to an embodiment, the organic substrate 705 may also include one or more conductive traces 707, vias 706, and pads 708 to provide electrical routing in the organic substrate 705. The conductive traces 707, vias 706, and pads 708 may be any suitable conductive material typically used in organic packaging applications (e.g., copper, tin, aluminum, alloys of conductive materials, and may also include multiple layers, such as seed layers, barrier layers, or the like).

According to an embodiment, the pixel mirror 730 may be anchored to the organic substrate 705 and oriented so that it extends over a cavity 720 formed in the organic substrate 705. The cavity 720 may be sized so that it is larger than the mirror 730 in order to allow the mirror 730 to be displaced into the cavity 720. According to an embodiment, the depth D of the cavity 720 may be chosen to allow for the desired amount of displacement of the pixel mirror 730 into the cavity 720. For example, increasing the depth D allows for greater displacement of the pixel mirror 730.

According to an embodiment, the pixel mirror 730 includes a piezoelectric layer 734 formed between a first electrode 732 and a second electrode 736. High performance piezoelectric materials suitable for actuating mirrors according to embodiments described herein, typically require a high temperature anneal (e.g., greater than 500° C.) in order to provide the proper crystal structure to attain the piezoelectric effect. As such, previous devices that utilize high performance piezoelectric materials typically require a substrate that is capable of withstanding high temperatures (e.g., silicon). Organic substrates, such as those described herein, typically cannot withstand temperatures above 260° C. However, embodiments of the present invention allow for a high performance piezoelectric layer 734 to be formed at much lower temperatures. For example, instead of a high temperature anneal, embodiments include depositing the piezoelectric layer 734 in an amorphous phase and then using a pulsed laser to crystalize the piezoelectric layer 734. In an embodiment, the pulsed laser annealing process may include the use of an excimer laser with an energy density in the range of 10-100 mJ/cm$^2$ and a pulse width in the range 10-50 ns. In an embodiment, the piezoelectric layer 734 may be deposited with a sputtering process, an ink jetting process, or the like. According to an embodiment, the piezoelectric layer may be lead zirconate titanate (PZT), potassium sodium niobate (KNN), zinc oxide (ZnO), or combinations thereof.

Manufacturing piezoelectrically actuated mirrors on organic substrates allows for a decrease in the manufacturing cost. For example technologies and materials developed for package/board processing are significantly less expensive than technologies and materials used for semiconductor processing. Fabricating steerable mirrors directly in the substrate or board reduces the cost over silicon MEMS because of the large panels (e.g., 510 mm×515 mm) used for organic substrate and board fabrication, the less expensive processing operations, and the less expensive materials used in those systems compared to silicon MEMS.

The first electrode 732 and the second electrode 736 may be electrically coupled to a voltage source by conductive traces 707 in the microelectronic package. For example, the voltage source may be a routing die (not shown) similar to the routing die described above. As such, a voltage applied across the first electrode 732 and the second electrode 736 may be generated. The voltage applied across the first electrode 732 and the second electrode 736 induces a strain in the piezoelectric layer 734 that causes displacement of the mirror 730. In an embodiment, the displacement of the pixel mirror 730 is proportional to the voltage across the first electrode 732 and the second electrode 736, as will be described in greater detail below. In FIG. 7A, the piezoelectric layer 734 and the second electrode 736 are extend only partially across the top surface of the first electrode 732, though embodiments are not limited to such configurations. For example, the piezoelectric layer 734 and the second electrode 736 may extend completely across the top surface of the first electrode 732.

According to an embodiment, the first electrode 732 and the second electrode 736 are formed with a conductive material. In some embodiments, the first electrode 732 and the second electrode 736 may be formed with the same conductive material used to form the conductive traces 707, vias 706, and pads 708 formed in the organic substrate 705. Such an embodiment allows for the manufacturing of the display to be simplified since additional materials are not needed, though embodiments are not limited to such configurations. For example, the electrodes 732, 736 may be different materials than the traces 706. Additional embodiments may include a first electrode 732 that is a different material than the second electrode 736. The conductive material used for the first electrode 732 and the second electrode 736 may be any conductive material (e.g., copper, aluminum, alloys, etc.).

According to an embodiment, a reflective surface 738 may be formed on the pixel mirror 730. In the illustrated embodiment, the reflective surface 738 may substantially cover the exposed portion of the first electrode 732. As such, displacing the mirror 730 allows for the reflective surface 738 to be displaced as well. The reflective surface 738 may be sized to capture light that is emitted from a light source. Minimizing the size of the reflective surface 738 and the pixel mirror 730 may allow for more mirrors to be formed in a given area or allow for the mirror to be driven with less power. For example, the reflective surface 738 may have a surface area between approximately 50 μm-100 μm by 200 μm-500 μm, though reflective surfaces 738 that have smaller or larger surface areas may also be formed according to embodiments of the invention.

According to an embodiment, the reflective surface 738 may have a surface roughness that is less than approximately 700 nm. Additional embodiments may include reflective surfaces 738 that have a surface roughness that is less than approximately 100 nm. Yet another embodiment may have a surface roughness that is less than approximately 10 nm. The surface roughness may be dictated by the deposition techniques used to form the reflective surface 738. Additionally, surface treatments may be used to further reduce the surface roughness of the reflective surface 738. According to an embodiment, the reflective surface 738 may be any reflective material. For example, the reflective surface 738 may be aluminum, silver, gold, tin, alloys of reflective materials, or the like. According to an embodiment, a protective coating 739 may be formed over the reflective surface 738 to prevent oxidation or other damage. For example, the protective coating may be any optically clear material.

While a distinct material layer is illustrated in FIG. 7A as being the reflective surface 738, embodiments may also include using a top surface of an electrode 732, 736 as the reflective surface 738. For example, in typical microelectronic packaging operations, copper may be deposited with a surface roughness of approximately 100 nm, and the surface roughness is then increased with a surface roughening operation in order to increase the adhesion between layers. In an embodiment, the surface roughing operation may be omitted and the copper with a surface roughness of approximately 100 nm may be used as the reflective surface 738.

Figure 7B:
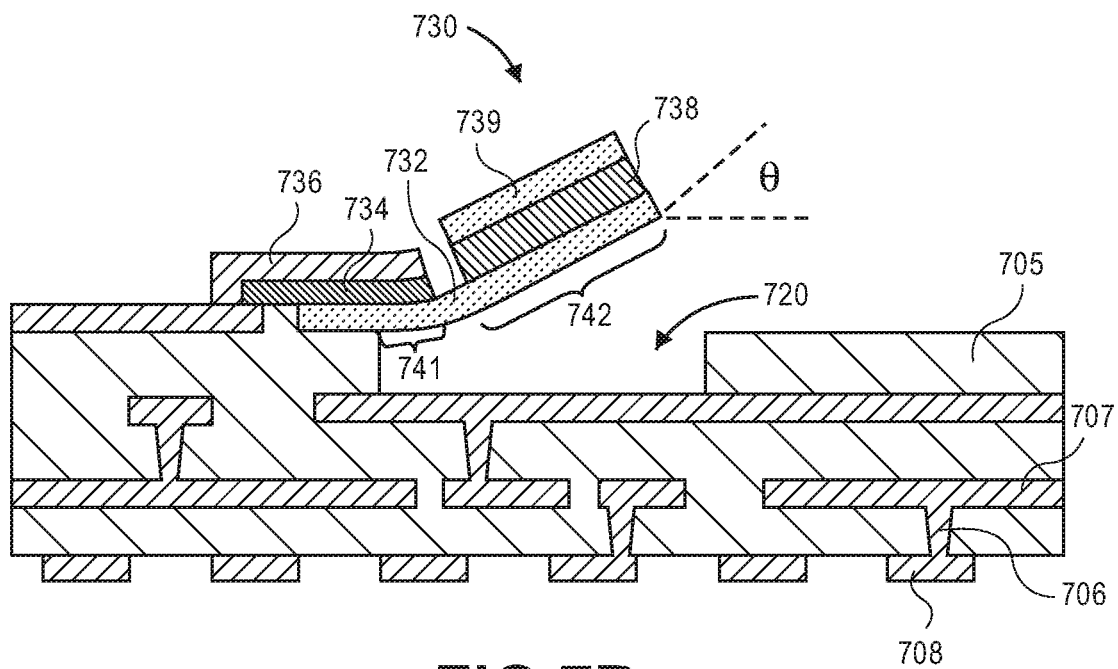
FIG. 7B is a cross-sectional illustration of the piezoelectric mirror in FIG. 7A being actuated, according to an embodiment of the invention.

Referring now to FIG. 7B, a cross-sectional illustration of an organic substrate 705 with a pixel mirror 730 in an actuated state is shown, according to an embodiment of the invention. The pixel mirror 730 may be displaced by applying a voltage across the first electrode 732 and the second electrode 736. The voltage produces strain in the piezoelectric layer 734 that causes the pixel mirror 730 to displace towards or away from the substrate 705, depending on the bias of the voltage.

As illustrated in FIG. 7B, the pixel mirror 730 is deflected away from substrate 705 at an angle θ. The deflection angle θ may be proportional to the voltage across the first electrode 732 and the second electrode 736. In an embodiment, the deflection angle θ is limited by the plastic deformation of the first and second electrodes 732, 736 (i.e., the angle θ may be up to the point where the deformation regime of the electrodes changes from elastic deformation to plastic deformation). For example, the deflection angle θ may be approximately 30° or less when copper is used for the first and second electrodes 732, 736. However, it is to be appreciated that deflection angles of approximately 10° or less may be obtained by applying voltages between approximately 10-20 volts, depending on the geometry of the pixel mirror 730. As illustrated, the pixel mirror 730 includes a non-linear (e.g., curved) portion 741 where the piezoelectric layer 734 is formed and a linear portion 742 where there is no piezoelectric layer 734. Accordingly, the reflective surface 738 may be formed on a surface that does not curve when the actuator deflects.

According to an embodiment, the pixel mirror 730 may be deflected in an analog manner to any deflection angle less than the maximum deflection angle θ. Accordingly, embodiments of the invention may allow for incoming optical beams to be reflected to more than one location. Therefore, the pixel mirror 730 may be able to be deflected to angles that allow for adjusting to change the viewing angle, account for stretching in the device, or allow for other visual effects (e.g., 3-D display).

According to an additional embodiment of the invention, the mirror formed on the actuator may also be a discrete component that is bonded to the actuator instead of being deposited onto the actuator. In one embodiment, the reflective surface may be a die that is mounted to the pixel mirror with a bonding layer. For example, the bonding layer may be an epoxy, a solder, or the like. Forming the reflective surface as a discrete die may allow for a plurality of reflective surfaces to be fabricated on a substrate other than the organic substrate 305, and then the die may be mounted to a pixel mirror with a pick and place tool, or any other mounting technique. Forming the reflective surface as a discrete component may also allow for more complex mirrors to be used without significantly decreasing the throughput. For example, forming the mirror as a discrete component may allow for more complex mirror shapes such as concave or convex mirrors, or for different filters or polarizers to be used. In addition to using a die for the reflective surface, embodiments may also include a reflective surface that is a thin sheet of reflective material (e.g., aluminum, silver, gold, tin, alloys of reflective materials, etc.).

Referring now to FIGS. 8A-8D, a series of plan view illustrations of pixel mirrors 830 are shown, according to various embodiments of the invention. In order to not unnecessarily obscure the Figures, the reflective surface is omitted. However, it is to be appreciated that the reflective surface may be mounted or formed on the pixel mirrors 830 similar to the devices described above. Additionally, vias or other conductive features used to electrically couple the pixel mirrors 830 to a power source used to drive the actuation is omitted in order to not unnecessarily obscure the Figures.

Figure 8A:
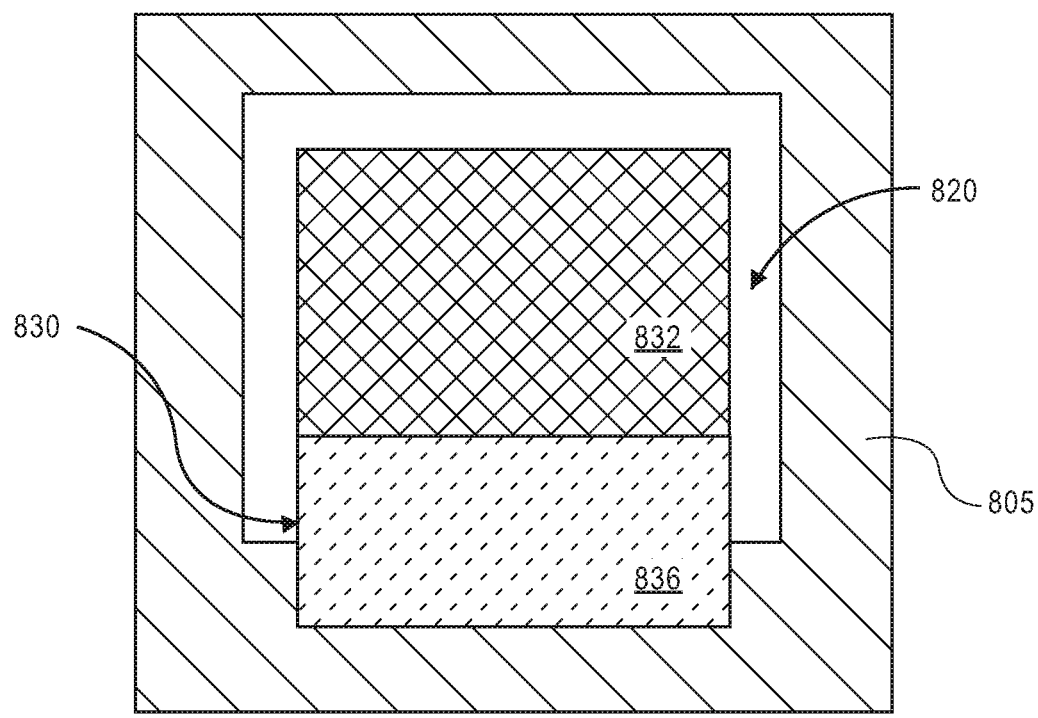
FIG. 8A is a plan view of a pixel mirror that extends over a cavity and is anchored to an organic substrate along one edge of the cavity, according to an embodiment of the invention.

Referring now to FIG. 8A, the second electrode 836 extends out from the organic substrate 805 over the cavity 820. According to an embodiment, the width of the first and second electrodes 832, 836 may be substantially equal to each other or the second electrode 836 may be a different width than the first electrode. As such, the second electrode 836 and the piezoelectric layer (not visible in FIG. 8A) may extend substantially along an entire edge of the first electrode 832. Accordingly, the pixel mirror 832 forms a cantilever beam that can be deflected into the cavity 820 or away from the organic substrate 805. Such an embodiment may allow for deflection about a single axis and, therefore, may be suitable for use in one-dimensional reflecting applications.

Figure 8B:
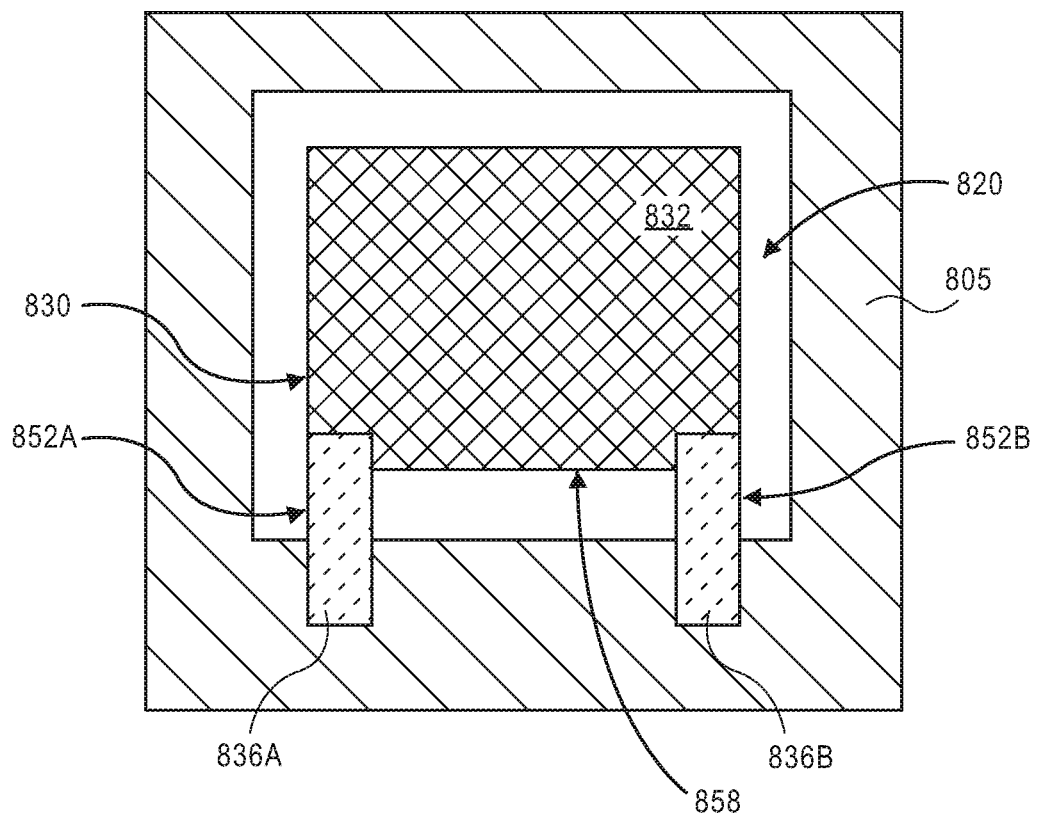
FIG. 8B is a plan view of a pixel mirror that includes two actuation arms anchored to an organic substrate, according to an embodiment of the invention.

Referring now to FIG. 8B, a plan view illustration of a pixel mirror 830 that is anchored to the organic substrate 805 with two actuation arms 852 is shown, according to an embodiment of the invention. As illustrated in FIG. 8B, actuation arms 852A and 852B are formed on opposite ends of an edge 858 of the first electrode 832. In an embodiment, the actuation arms 852 may be beams that extend out from the organic substrate 805 over the cavity 820. Each actuation arm 852 may include a stack that includes a portion of the piezoelectric layer (not visible in FIG. 8B) formed between a portion of the first electrode 832 and a portion of the second electrode 836. It is to be appreciated that a portion of the first electrode 832 also attaches to the organic substrate 805. Accordingly, the first electrode 832 may be a single continuous layer that has beam like portions that extend out from the organic substrate 805 and attach to a pad portion on which the reflective layer (not shown) may be placed or formed. In contrast, the second electrode 836 may be a discontinuous layer. For example, the first actuation arm 852A may include a first portion of the second electrode 836A and the second actuation arm 852B may include a second portion of the second electrode 836B. In an embodiment, the first portion 836A may be electrically isolated from the second portion 836B in order to allow for each actuation arm 852 to be controlled independently. Alternative embodiments may have the first portion 836A and the second portion 836B electrically coupled to each other and held at the same voltage.

In the pixel mirrors illustrated in FIGS. 8A-8B, the second electrode 836 and the piezoelectric layer (not visible in FIGS. 8A-8B) do not extend completely across the top surface of the first electrode 832. However, embodiments are not limited to such configurations. For example, the second electrode 836 and the piezoelectric layer may extend completely over a top surface of the first electrode 832. The increased length of the piezoelectric layer and the second electrode 836 may allow for a greater deflection angle to be obtained with the same voltages, compared to the embodiments where the piezoelectric layer and the second electrode do not extend across the entire length of the first electrode.

Figure 8C:
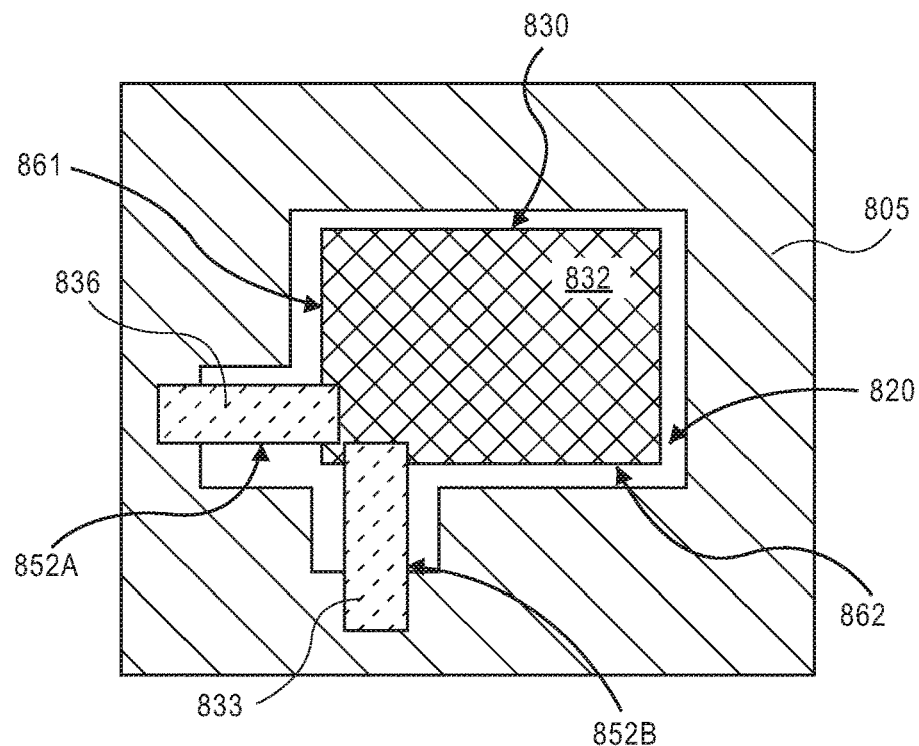
FIG. 8C is a plan view of a pixel mirror with two actuation arms that are formed on different edges of the actuated structure, according to an embodiment of the invention.

According to an additional embodiment of the invention, the pixel mirrors may be deflected in more than one direction to enable two-dimensional switching. One example of such an embodiment is illustrated in FIG. 8C. As illustrated, a pixel mirror 830 may have a first actuation arm 852A formed along a first edge 861 of the first electrode 832 and a second actuation arm 852B formed along a second edge 862 of the first electrode 832. According to an embodiment, the first actuation arm 852A may include a second electrode 836 that is formed over a piezoelectric layer (not visible in FIG. 8C) and the second actuation arm 852B may include a third electrode 833 that is also formed over a piezoelectric layer (not visible in FIG. 8C). According to an embodiment, the second electrode 836 and the third electrode 833 may be electrically isolated from each other and able to operate independently from each other. Accordingly, the pixel mirror 830 may be deflected about an axis substantially parallel to the first edge 861 and out of the plane of the display by the first actuation arm 852A and about an axis substantially parallel to the second edge 862 and out of the plane of the display by the second actuation arm 852B.

Figure 8D:
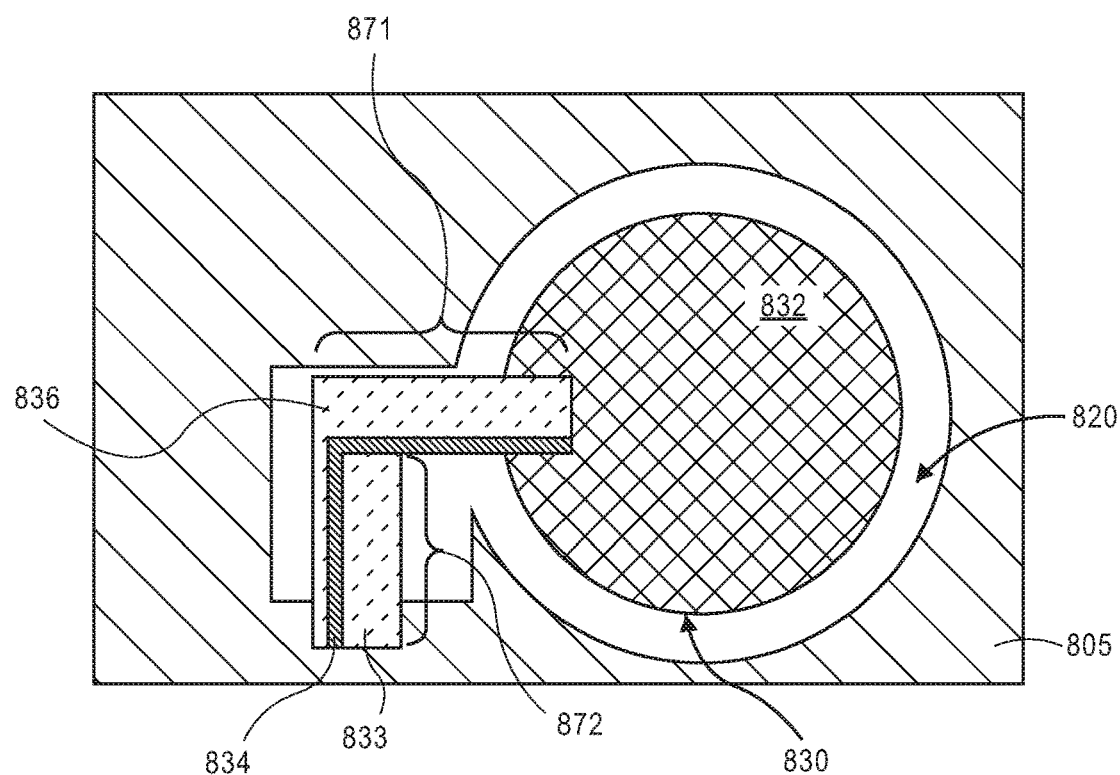
FIG. 8D is a plan view of a pixel mirror that includes a single actuation arm that allows for deflection in multiple directions, according to an embodiment of the invention.

Referring now to FIG. 8D, a plan view illustration of a microelectronic package 800 with an actuator 830 that may be deflected in more than one direction is shown according to an additional embodiment of the invention. Instead of requiring two actuation arms that are attached to different edges of the first electrode 832, embodiments of the invention may include an actuation arm that has a first length 871 and a second length 872. According to an embodiment, the second length 872 may be substantially orthogonal to the first length 871. In order to isolate actuation to the different lengths of the actuation arm, a second electrode 836 may be formed primarily along the first length 871, and a third electrode 833 may be formed along the second length 872. As shown in FIG. 8D, the spacing between the second electrode 836 and the third electrode 833 exposes a portion of the piezoelectric layer 834 that is formed below both the second and the third electrodes 836, 833.

In some embodiments, the second electrode 836 may also extend along the second length 872 in order to be electrically coupled to a contact on the organic substrate 805. However, it is to be appreciated that the surface area of the third electrode 833 over the piezoelectric layer 834 in the second length 872 is greater than the surface area of the second electrode 836. As such, the actuation provided by the second length is primarily controlled by applying a voltage across the third electrode 833 and the first electrode 832, and the actuation provided by the first length 871 is primarily controlled by applying a voltage across the second electrode 836 and the first electrode 832.

While the embodiments described in the previous Figures have included actuators with substantially rectangular shaped pads for supporting the reflective surface, it is to be appreciated that embodiments are not limited to such configurations. For example, 8D illustrates a pixel mirror 830 that has a substantially circular pad for supporting a reflective surface. The use of a circular shaped pad may allow for the elimination of corner effects experienced with the rectangular shaped pads. Additionally, it is to be appreciated that embodiments of the invention may also include an actuator with a piezoelectric layer and a second electrode that cover the entire top surface of the first electrode, and which are substantially circular as well. Furthermore, embodiments may include a substantially circular shaped pad in combination with any of the actuation arm configurations described herein (e.g., single arm, multi-arm, multi-arm with multiple axis deflection, single-arm with multiple axis deflection, etc.)

Figure 9A:
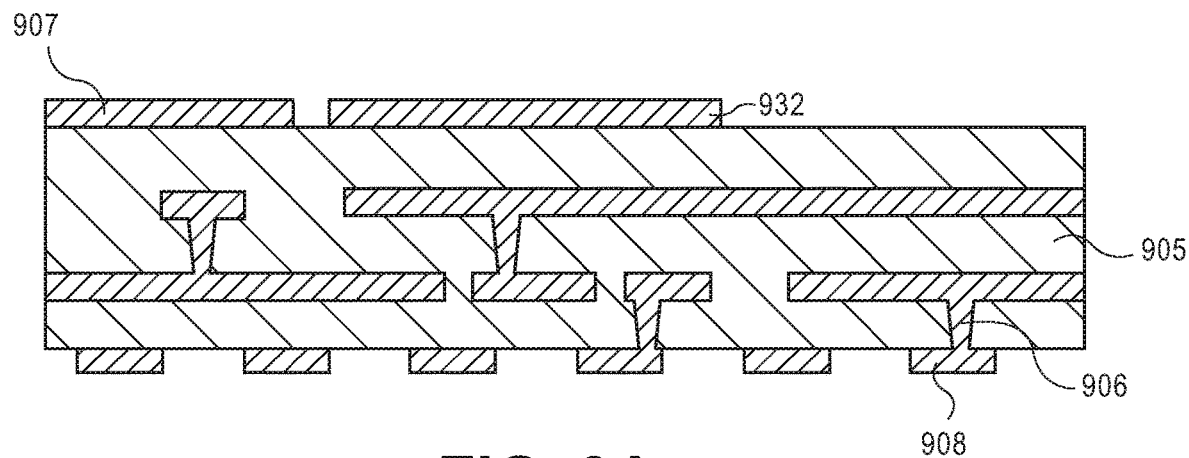
FIG. 9A is a cross-sectional illustration of an organic substrate after the first electrode has been formed, according to an embodiment of the invention.

Referring now to FIGS. 9A-9E, a process flow for forming an actuator in an organic substrate is shown according to an embodiment of the invention. Referring now to FIG. 9A, the first electrode 932 is formed over a top surface of an organic substrate 905. According to an embodiment, the first electrode 932 may be formed with manufacturing processes known in the semiconductor and substrate manufacturing industries, such as semi-additive processing, subtractive processing, or the like.

Figure 9B:
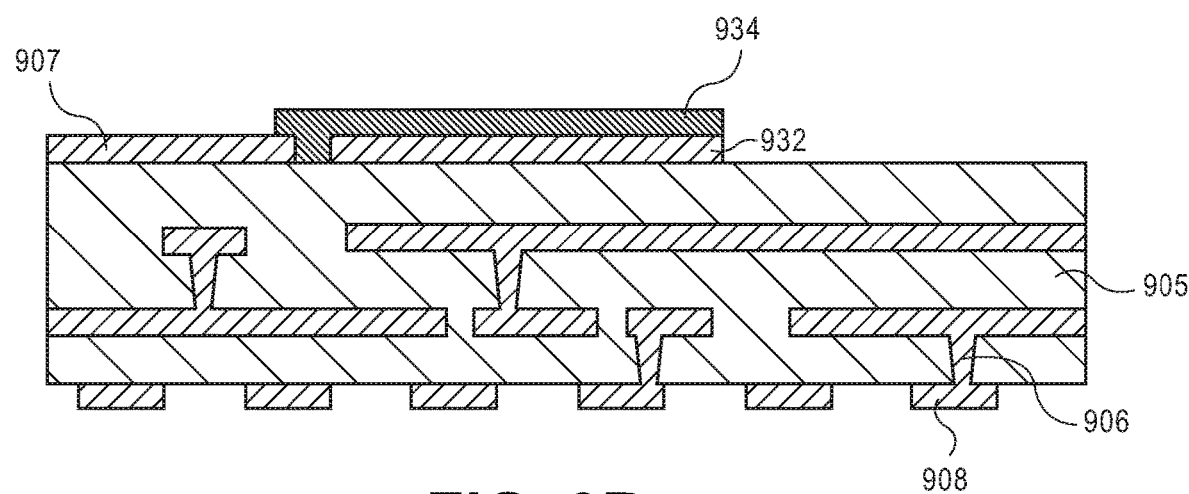
FIG. 9B is a cross-sectional illustration of the organic substrate after the piezoelectric layer has been formed, according to an embodiment of the invention.

Referring now to FIG. 9B, a piezoelectric material may be formed over the first electrode 932 to form a piezoelectric layer 934. According to an embodiment, the piezoelectric layer may be deposited in an amorphous phase. In order to improve the piezoelectric properties of the piezoelectric layer 934, the amorphous layer may be crystallized with a laser annealing process. For example, the piezoelectric layer 934 may be deposited with a sputtering process, an ink jetting process, or the like. According to an embodiment, the piezoelectric layer 934 may be PZT, KNN, ZnO, or combinations thereof. In an embodiment, the laser annealing process may be a pulsed laser anneal and implemented so that the temperature of the organic substrate 905 does not exceed approximately 260° C. For example, the pulsed laser annealing process may include the use of an excimer laser with an energy density in the range of 10-100 mJ/cm$^2$ and a pulse width in the range 10-50 ns.

Figure 9C:
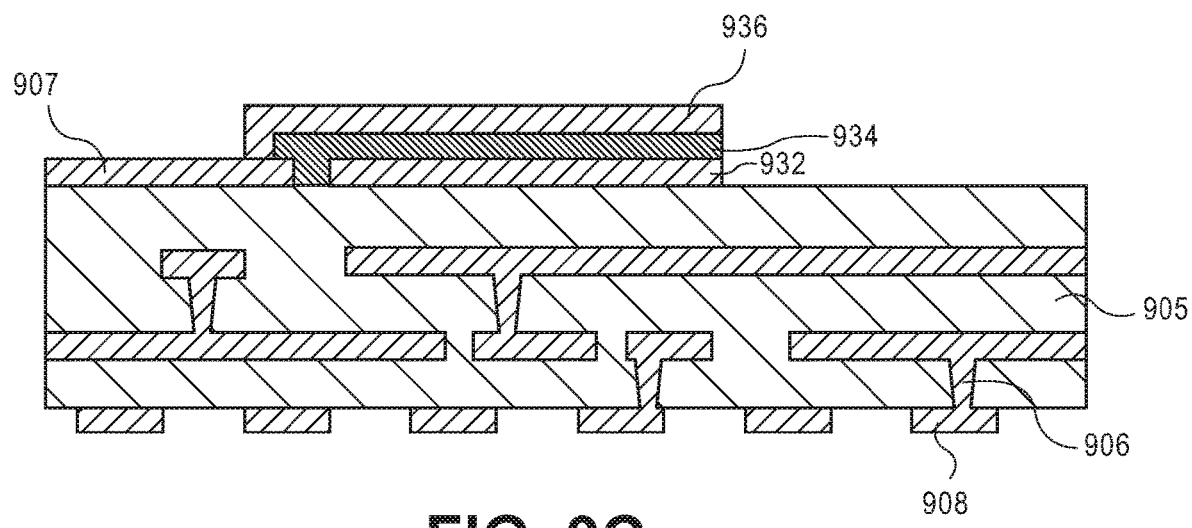
FIG. 9C is a cross-sectional illustration of the organic substrate after the second electrode has been formed, according to an embodiment of the invention.

Referring now to FIG. 9C, a second electrode 936 may be formed over the piezoelectric layer 934. According to an embodiment, the second electrode 936 may be formed with damascene processes, electrolytic plating, electroless plating, sputtering, evaporation, or other forming processes. As illustrated, the second electrode 936 may be electrically coupled to a conductive trace 907 on the organic substrate 905 that is electrically isolated from the first electrode 932. Accordingly, a voltage may be applied across the first electrode 932 and the second electrode 936. Furthermore, it is to be appreciated that additional electrodes may be formed over the piezoelectric layer 934 in order to provide additional actuation arms that allow for deflection of the actuator about more than one axis.

Figure 9D:
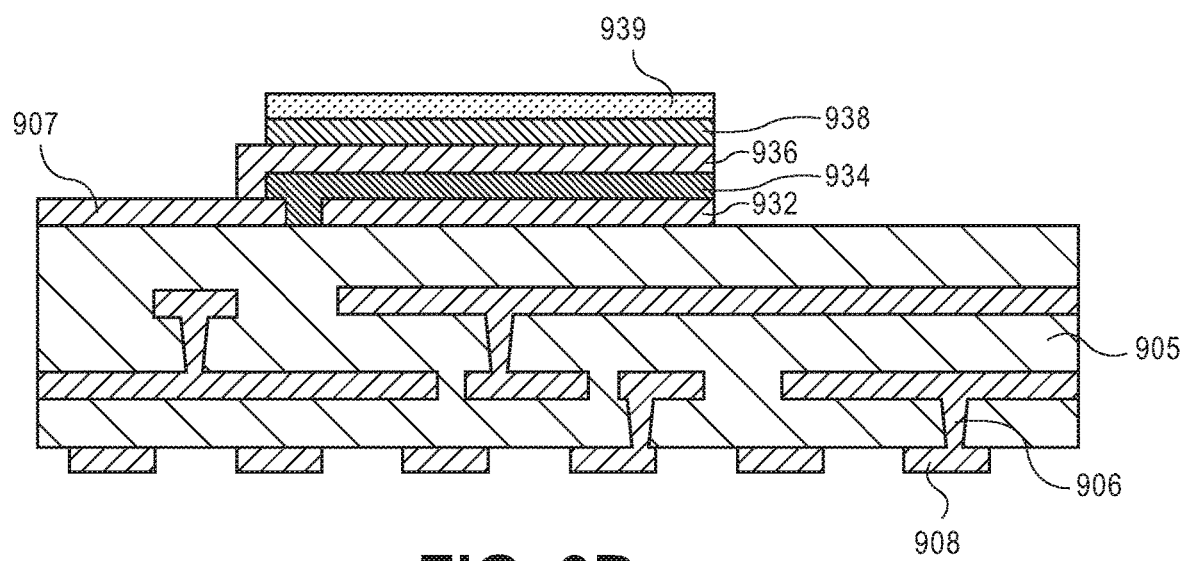
FIG. 9D is a cross-sectional illustration of the organic substrate after the reflective surface has been formed, according to an embodiment of the invention.

Referring now to FIG. 9D, a reflective surface 938 may be formed over the second electrode 936. According to an embodiment, the reflective surface 938 may be formed by depositing and patterning a layer of reflective material (e.g., silver, aluminum, tin, gold, etc.). For example, the deposition process may be a sputtering, evaporation, or other suitable deposition process that is compatible with organic substrates. In some embodiments a protective coating 939 may also be deposited over the reflective surface 938 in order to prevent oxidation or other damage.

Figure 9E:
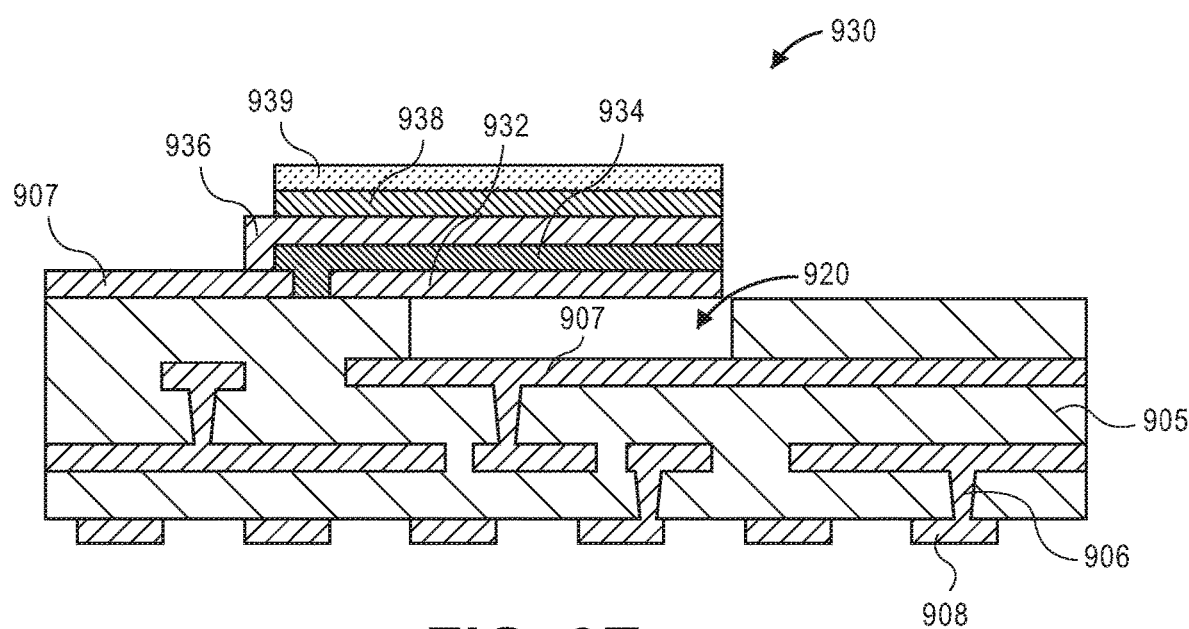
FIG. 9E is a cross-sectional illustration of the organic substrate after a cavity is formed in the organic substrate below the pixel mirror, according to an embodiment of the invention.

Referring now to FIG. 9E, the pixel mirror 930 is released from the organic substrate 905 in order to allow for actuation. The pixel mirror 930 may be released by forming a cavity 920 below a portion of the first electrode 932. For example, the cavity may be formed with a photolithographic and etching process that selectively removes a portion of the organic substrate 905. For example, the etching process may be a reactive ion etching process, or any other wet or dry etching process. In embodiments where the pad region is too large to allow for adequate removal of the organic substrate 905 below the pad, one or more holes may be formed through the pixel mirror 930 to allow for the chemistry of the etching process to pass through the pixel mirror 930 and remove the organic substrate 905 below. As illustrated, embodiments may use a trace 907 as an etch-stop layer to provide the desired depth of the cavity.

While the process for forming the actuator in FIGS. 9A-9E illustrate a pixel mirror with a second electrode and the piezoelectric layer substantially covering the first electrode, it is to be appreciated that substantially similar operations may be used to form any of the pixel mirrors described herein. For example, the formation of the piezoelectric layer 934 and the second electrode 936 may be modified such that a portion of the first electrode 932 remains exposed and the reflective surface 938 is formed over the first electrode 932, similar to the pixel mirror described with respect to FIG. 7A. Additional embodiments may include forming the mirror with a discrete die that is mounted to the pixel mirror 930 instead of being deposited on an electrode. Additionally, it is to be appreciated that one or more actuation arms may be defined with the patterning and deposition processes as well.

Figure 10:
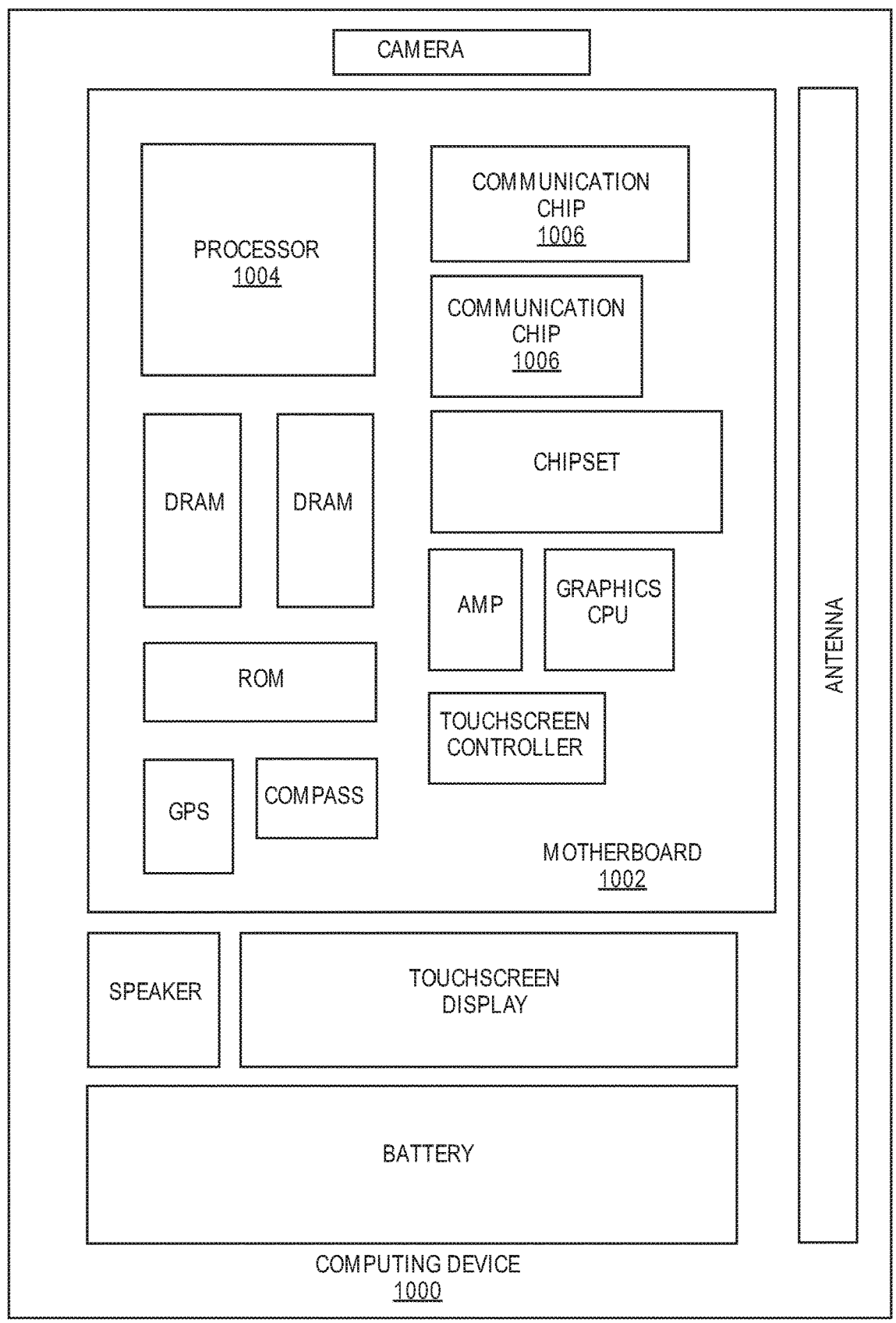
FIG. 10 is a schematic of a computing device built in accordance with an embodiment of the invention.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor may be packaged on an organic substrate that includes an array of pixel mirrors and routing mirrors, in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip may be packaged on an organic substrate that includes an array of pixel mirrors and routing mirrors, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a display, comprising: an organic substrate; an array of pixel mirrors formed on the organic substrate, wherein each of the pixel mirrors is actuatable about one or more axes out of the plane of the organic substrate; an array of routing mirrors formed on the organic substrate, wherein each of the routing mirrors is actuatable about two axes out of the plane of the organic substrate; and a light source for emitting light towards the array of routing mirrors, wherein light emitted from the light source is reflected to one or more of the pixel mirrors by one of the routing mirrors.

Additional embodiments of the invention include a display, wherein the array of pixel mirrors are arrange in a plurality of rows and a plurality of columns.

Additional embodiments of the invention include a display, wherein the array of routing mirrors is aligned so that each routing mirror is centered on a column of pixel mirrors.

Additional embodiments of the invention include a display, wherein every column of pixel mirrors is centered with at least one routing mirror.

Additional embodiments of the invention include a display, wherein every column of pixel mirrors is not centered with at least one routing mirror.

Additional embodiments of the invention include a display, wherein the light source is above the organic substrate.

Additional embodiments of the invention include a display, wherein the organic substrate is a flexible substrate.

Additional embodiments of the invention include a display, wherein each of the pixel mirrors comprises: a first electrode; a piezoelectric layer formed on the first electrode; a second electrode formed on the piezoelectric layer; and a reflective surface formed on the pixel mirror.

Additional embodiments of the invention include a display, wherein each of the pixel mirrors include one or more actuation arms, and wherein each of the pixel mirrors is anchored to the organic substrate by the one or more actuation arms.

Additional embodiments of the invention include a display, wherein a first actuation arm of each pixel mirror deflects the pixel mirror about a first axis and a second actuation arm of each pixel mirror deflects the pixel mirror about a second axis.

Additional embodiments of the invention include a display, wherein a first actuation arm of each pixel mirror has a first length for deflecting the pixel mirror about a first axis and a second length oriented substantially perpendicular to the first length for deflecting the pixel mirror about a second axis.

Additional embodiments of the invention include a display, wherein the first and second electrodes are formed along the first and second lengths of the first actuation arm, a third electrode is formed on the second length of the first actuation arm, and wherein a surface area of the third electrode over the second length is greater than a surface area of the second electrode over the second length.

Embodiments of the invention include a method of forming a display on an organic substrate, comprising: forming an array of pixel mirrors and an array of routing mirrors on the organic substrate, wherein forming the pixel mirrors and the routing mirrors comprises: forming a plurality of first electrodes over the organic substrate; depositing a piezoelectric layer over the first electrodes, wherein the piezoelectric layer is an amorphous layer; crystallizing the piezoelectric layer with a pulsed laser anneal, wherein a temperature of the organic substrate does not exceed 260° C.; forming a plurality of second electrodes over a top surface of the piezoelectric layer; forming a plurality of reflective surfaces above a pad portion of the first electrodes; and forming a plurality of cavities below a portion of the first electrodes.

Additional embodiments of the invention include a method of forming a display, wherein the pulsed laser anneal is performed with an Excimer laser with an energy density in the range of approximately 10-100 mJ/cm$^2$ and pulse width in the range of approximately 10-50 nanoseconds.

Additional embodiments of the invention include a method of forming a display, further comprising: mounting a light source onto the substrate, wherein the light source emits light towards the array of routing mirrors, wherein light emitted from the light source may be deflected to one or more of the pixel mirrors by a routing mirror.

Additional embodiments of the invention include a method of forming a display, wherein each of the pixel mirrors are actuatable in one direction, and wherein each of the routing mirrors are actuatable in two directions.

Additional embodiments of the invention include a method of forming a display, wherein the array of pixel mirrors are arranged into a plurality of rows and columns, and wherein the each routing mirror in the array of routing mirrors is centered with a row of pixel mirrors. Additional embodiments of the invention include a method of forming a display, wherein the piezoelectric layers are deposited with a sputtering or ink-jetting process.

Additional embodiments of the invention include a method of forming a display, wherein the cavities are formed with a reactive ion etching process, and wherein an etch-stop layer is formed in the organic substrate below the first electrodes.

Embodiments of the invention include a display, comprising: a flexible organic substrate; an array of pixel mirrors formed on the organic substrate, wherein each of the pixel mirrors is actuatable about one or more axes out of the plane of the organic substrate; an array of routing mirrors formed on the organic substrate, wherein each of the routing mirrors is actuatable about two axes out of the plane of the organic substrate, and wherein each of the routing mirrors and each of the pixel mirrors comprise: a first electrode; a piezoelectric layer formed on the first electrode; a second electrode formed on the piezoelectric layer; and a reflective surface; and a light source for emitting light towards the array of routing mirrors, wherein light emitted from the light source is reflected to one or more of the pixel mirrors by one of the routing mirrors.

Additional embodiments of the invention include a display, wherein the array of pixel mirrors are arrange in a plurality of rows and a plurality of columns.

Additional embodiments of the invention include a display, wherein every column of pixel mirrors is centered with at least one routing mirror.

Additional embodiments of the invention include a display, wherein every column of pixel mirrors is not centered with at least one routing mirror, and wherein every pixel mirror is actuatable about two axes out of the plane of the organic substrate.

Additional embodiments of the invention include a display, wherein the light source emits more than one color.

Additional embodiments of the invention include a display, wherein the light source is a modulated light source.

What is claimed is:
1. A display, comprising:
an organic substrate;
an array of pixel mirrors formed on the organic substrate, wherein each of the pixel mirrors is actuatable about one or more axes out of the plane of the organic substrate;
an array of routing mirrors formed on the organic substrate, wherein each of the routing mirrors is actuatable about two axes out of the plane of the organic substrate; and
a light source for emitting light towards the array of routing mirrors, wherein light emitted from the light source is reflected to one or more of the pixel mirrors by one of the routing mirrors.
2. The display of claim 1, wherein the array of pixel mirrors are arrange in a plurality of rows and a plurality of columns.
3. The display of claim 2, wherein the array of routing mirrors is aligned so that each routing mirror is centered on a column of pixel mirrors.
4. The display of claim 3, wherein every column of pixel mirrors is centered with at least one routing mirror.
5. The display of claim 3, wherein every column of pixel mirrors is not centered with at least one routing mirror.
6. The display of claim 1, wherein the light source is above the organic substrate.
7. The display of claim 1, wherein the organic substrate is a flexible substrate.
8. The display of claim 1, wherein each of the pixel mirrors comprises:
a first electrode;
a piezoelectric layer formed on the first electrode;
a second electrode formed on the piezoelectric layer; and
a reflective surface formed on the pixel mirror.
9. The display of claim 8, wherein each of the pixel mirrors include one or more actuation arms, and wherein each of the pixel mirrors is anchored to the organic substrate by the one or more actuation arms.
10. The display of claim 9, wherein a first actuation arm of each pixel mirror deflects the pixel mirror about a first axis and a second actuation arm of each pixel mirror deflects the pixel mirror about a second axis.
11. The display of claim 9, wherein a first actuation arm of each pixel mirror has a first length for deflecting the pixel mirror about a first axis and a second length oriented substantially perpendicular to the first length for deflecting the pixel mirror about a second axis.
12. The display of claim 11, wherein the first and second electrodes are formed along the first and second lengths of the first actuation arm, a third electrode is formed on the second length of the first actuation arm, and wherein a surface area of the third electrode over the second length is greater than a surface area of the second electrode over the second length.
13. A method of forming a display on an organic substrate, comprising:
forming an array of pixel mirrors and an array of routing mirrors on the organic substrate, wherein forming the pixel mirrors and the routing mirrors comprises:
forming a plurality of first electrodes over the organic substrate;
depositing a piezoelectric layer over the first electrodes, wherein the piezoelectric layer is an amorphous layer;
crystallizing the piezoelectric layer with a pulsed laser anneal, wherein a temperature of the organic substrate does not exceed 260° C.;
forming a plurality of second electrodes over a top surface of the piezoelectric layer;
forming a plurality of reflective surfaces above a pad portion of the first electrodes; and
forming a plurality of cavities below a portion of the first electrodes.
14. The method of claim 13, wherein the pulsed laser anneal is performed with an Excimer laser with an energy density in the range of approximately 10-100 mJ/cm$^2$ and pulse width in the range of approximately 10-50 nanoseconds.
15. The method of claim 13, further comprising:
mounting a light source onto the substrate, wherein the light source emits light towards the array of routing mirrors, wherein light emitted from the light source may be deflected to one or more of the pixel mirrors by a routing mirror.
16. The method of claim 15, wherein each of the pixel mirrors are actuatable in one direction, and wherein each of the routing mirrors are actuatable in two directions.
17. The method of claim 13, wherein the array of pixel mirrors are arranged into a plurality of rows and columns, and wherein the each routing mirror in the array of routing mirrors is centered with a row of pixel mirrors.
18. The method of claim 13, wherein the piezoelectric layers are deposited with a sputtering or ink-jetting process.
19. The method of claim 13, wherein the cavities are formed with a reactive ion etching process, and wherein an etch-stop layer is formed in the organic substrate below the first electrodes.
20. A display, comprising:
a flexible organic substrate;
an array of pixel mirrors formed on the organic substrate, wherein each of the pixel mirrors is actuatable about one or more axes out of the plane of the organic substrate;
an array of routing mirrors formed on the organic substrate, wherein each of the routing mirrors is actuatable about two axes out of the plane of the organic substrate, and wherein each of the routing mirrors and each of the pixel mirrors comprise:
a first electrode;
a piezoelectric layer formed on the first electrode;
a second electrode formed on the piezoelectric layer; and
a reflective surface; and
a light source for emitting light towards the array of routing mirrors, wherein light emitted from the light source is reflected to one or more of the pixel mirrors by one of the routing mirrors.

21. The display of claim 20, wherein the array of pixel mirrors are arrange in a plurality of rows and a plurality of columns.

22. The display of claim 21, wherein every column of pixel mirrors is centered with at least one routing mirror.

23. The display of claim 21, wherein every column of pixel mirrors is not centered with at least one routing mirror, and wherein every pixel mirror is actuatable about two axes out of the plane of the organic substrate.

24. The display of claim 20, wherein the light source emits more than one color.

25. The display of claim 24, wherein the light source is a modulated light source.

* * * * *